United States Patent [19]
Kudva et al.

[11] Patent Number: 6,167,557
[45] Date of Patent: Dec. 26, 2000

[54] METHOD AND APPARATUS FOR LOGIC SYNTHESIS EMPLOYING SIZE INDEPENDENT TIMING OPTIMIZATION

[75] Inventors: Prabhakarn N. Kudva, Danbury, Conn.; David S. Kung, Chappaqua; Leon Stok, Mount Kisco, both of N.Y.

[73] Assignee: International Business Machines Corporation, Armonk, N.Y.

[21] Appl. No.: 09/067,336

[22] Filed: Apr. 28, 1998

[51] Int. Cl.[7] ................................................. G06F 17/50
[52] U.S. Cl. ....................................................... 716/6; 716/5
[58] Field of Search ........................ 395/500.07, 500.06; 716/6, 5

[56] References Cited

U.S. PATENT DOCUMENTS

| | | | |
|---|---|---|---|
| 4,903,241 | 2/1990 | Boudewjins | 365/194 |
| 5,274,568 | 12/1993 | Blinne et al. | 395/500.4 |
| 5,282,148 | 1/1994 | Poirot et al. | 395/500.07 |
| 5,467,034 | 11/1995 | Manlove et al. | 327/63 |
| 5,471,409 | 11/1995 | Tani | 395/500.35 |
| 5,636,130 | 6/1997 | Salem et al. | 395/500.07 |
| 5,768,130 | 6/1998 | Lai | 395/500.4 |
| 5,982,315 | 11/1999 | Bazarjani et al. | 341/143 |

OTHER PUBLICATIONS

"Global Wires Harmful?", R.H. Otten, 1998.

Primary Examiner—Kevin J. Teska
Assistant Examiner—Hugh Jones
Attorney, Agent, or Firm—F. Chau & Associates, LLP

[57] ABSTRACT

Size independent timing optimization is performed on an initial circuit design using gain based models for logic cell types. A component library containing various logic elements in a plurality of sizes is provided and a single gain based model for each logic element (cell type) is created therefrom. Initial conditions for gain and delay are then established for each cell type. Gain based optimization, which is size independent, is then performed on the initial circuit design. The optimized size independent solution is then transformed into a realizable discrete circuit solution.

13 Claims, 4 Drawing Sheets

METHOD AND APPARATUS FOR LOGIC SYNTHESIS EMPLOYING SIZE INDEPENDENT TIMING OPTIMIZATION

BACKGROUND OF THE INVENTION

1. Field of the Invention

The present invention relates generally to logic circuit synthesis and more particularly relates to a computer-based method for size independent timing optimization of an initial logic design solution.

2. Description of the Related Art

Logic circuit synthesis involves a process of generating an initial circuit topology which satisfies the basic logic requirements and then optimizing the initial circuit topology to satisfy timing, load and physical area constraints. The initial design can be presented graphically as a schematic and also in a data file listing the included logic elements and their interconnection. The data file is generally referred to as a net list.

Optimization techniques operate on the net list to attain a satisfactory balance of the various circuit constraints. More specifically, timing correction is a technology dependent optimization of the net list where the goal is to meet the cycle time of the design. This is a phase of logic synthesis which involves extensive electrical and some boolean optimizations. The most important electrical optimizations are sizing and fan-out correction.

Timing correction in synthesis has traditionally operated on discrete libraries where there are discrete sized gates available for each gate type. A static timing analysis-based timing correction has typically been used, where various alternatives for sizes of the given type are attempted and a resulting error is evaluated. The error is generally referred to as "slack", which is a measure of the deviation from the simulated delay time compared to the desired cycle time. For example, an attempt to resize a particular gate in a design may involve trying out each alternative as a replacement in the design and reevaluating the slack for each trial. In a circuit whose critical path consists of N gates where each gate has M possible sizes, the cost of evaluating all possible alternatives is measured as $M^n \times T$, where T is the time required to evaluate each design alternative. As the size of the library (M) increases, the amount of processing power which is required for such an optimization quickly becomes significant.

In addition to the problem of processing overhead which is associated with the iterative approach typically employed in the prior art, the actual results from such a technique often deviate significantly from the simulation results. This is because traditional timing correction methods optimize the design based on an assumed wire load model. Typically, the wire loads seen by the output of a gate are assumed to be a function of the number of fan-outs of the gate. The size of each gate is selected during optimization based on this assumed wire load model. However, the assumed wire load model is often inaccurate, since no actual information regarding actual cell placement is available at this point in the optimization process.

Accordingly, there remains a need for a timing optimization approach which overcomes the shortcomings of prior art optimization solutions. The present invention employs a size independent approach which significantly reduces the iterative trial and error process used in previous methods and allows the size of gates to be selected after net list optimization, i.e., when gate placement information is available. This allows accurate modeling of the wire load presented at each stage of the circuit and accurate assignment of the associated gain for each stage.

SUMMARY OF THE INVENTION

In accordance with a method of the present invention, size independent timing optimization is performed on an initial circuit design. The method includes the steps of: reading a component library containing various logic elements in a plurality of sizes; creating a gain based model for each logic element (cell type); deriving initial conditions for gain and delay for each cell type; performing gain based optimization which is size independent; and transforming the optimized solution into a discrete solution, resulting in an optimized net list of the circuit.

In accordance with one form of the present invention, a computer-based logic synthesis and optimization system includes an optimization processor that receives an initial circuit design for optimization. The optimization processor is operatively coupled to a logic cell library including a plurality of cell types, each cell type having at least one associated logic element. The system further includes a gain based model library that includes a size independent model for each cell type employed in the circuit design. The optimization processor receives the initial circuit design, the logic cell library and the gain based model library and optimizes the circuit design in a size independent manner. The optimization processor assigns gate sizes to the optimized circuit design to provide a realizable circuit embodiment.

In accordance with an alternate embodiment of the present invention, the optimization processor determines whether the gain based model library is provided with the logic cell library. If not, the optimization processor generates the gain based model library based on the elements provided in the logic cell library.

These and other objects, features, and advantages of the present invention will become apparent from the following detailed description of illustrative embodiments thereof, which is to be read in connection with the accompanying drawings.

BRIEF DESCRIPTION OF THE DRAWINGS

The present invention will be described in detail in the following description of preferred embodiments with reference to the following figures wherein.

DETAILED DESCRIPTION OF PREFERRED EMBODIMENTS

Figure 1:
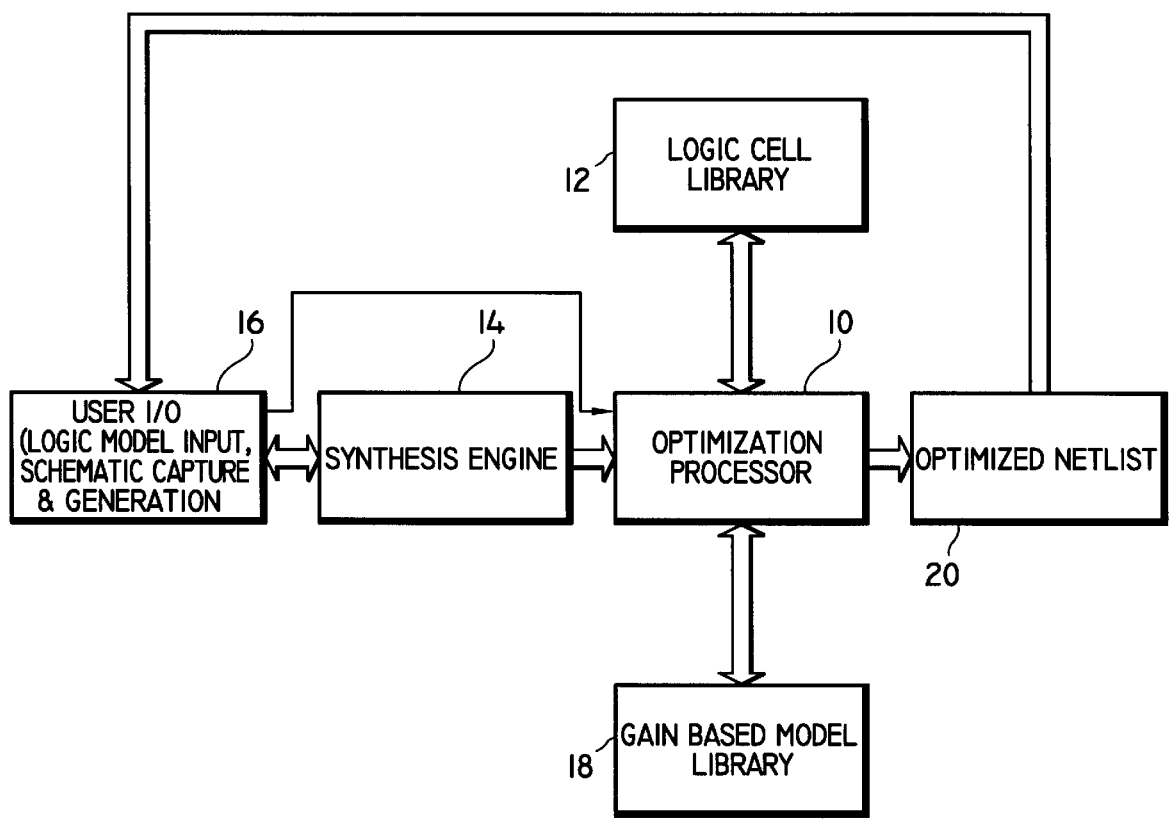
FIG. 1 is a block diagram of a logic circuit synthesis and optimization system formed in accordance with the present invention.
Figure 2:
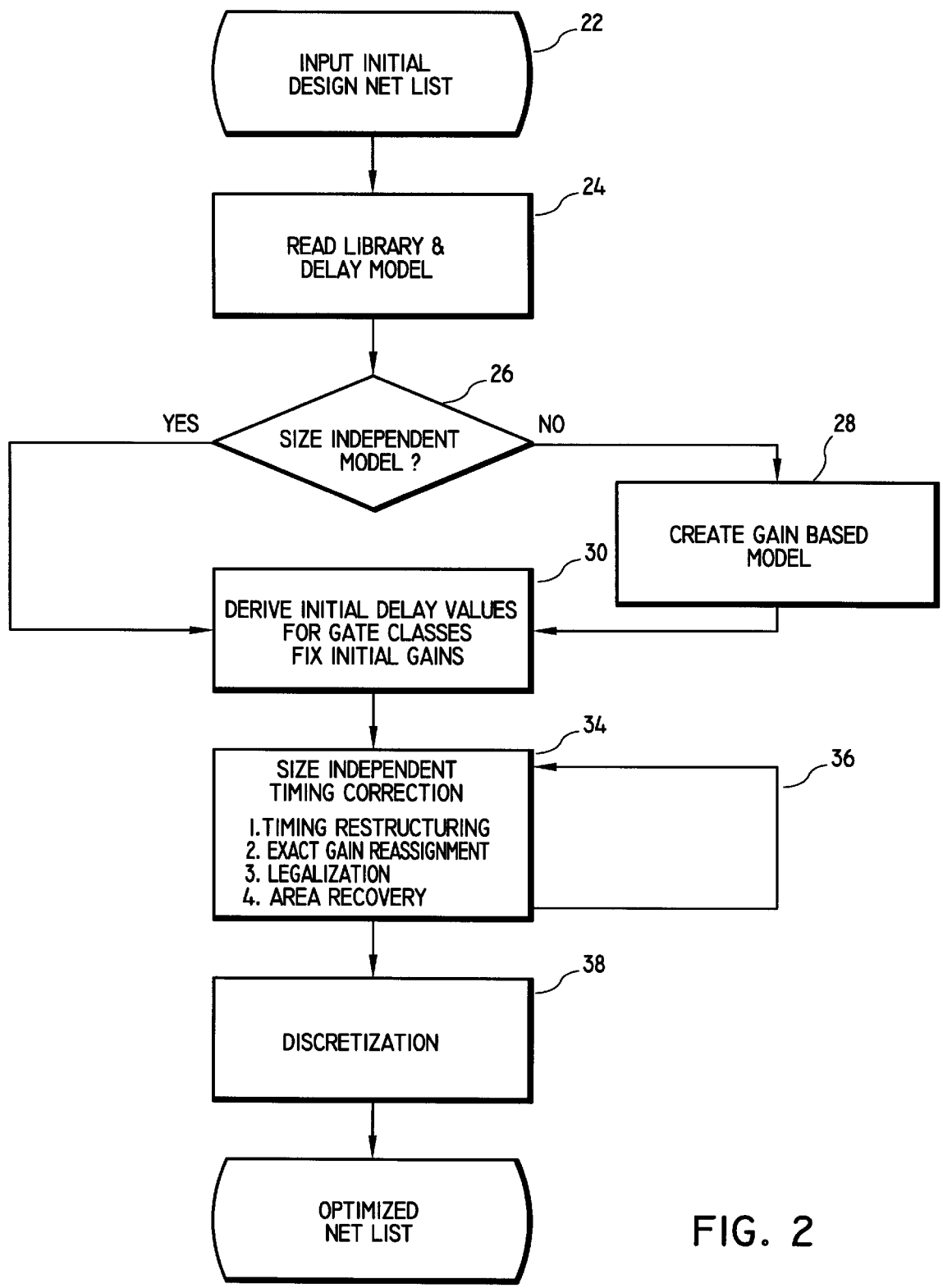
FIG. 2 is a flow chart illustrating a preferred method of size independent circuit optimization in accordance with the present invention.

The present invention provides a size independent timing optimization method for logic circuits which is depicted in the flow chart of FIG. 2. This method is particularly well suited for computer-based logic circuit optimization using a system, such as that illustrated in block diagram form in FIG. 1.

Referring to FIG. 1, a computer-based logic synthesis and optimization system formed in accordance with the present invention will generally include an optimization processor 10 having such elements as a central processing unit, random access memory, read only memory and other associated components which are conventional to a computer processing unit. Preferably, the optimization processor 10 is operating under the control of a computer program which implements a method in accordance with the present invention.

The optimization processor 10 is electrically connected to a logic cell library 12 which includes a database of circuit implementations for commonly used logic cell types. For each logic cell type (i.e., OR, NAND, NOR, JK flip flop and the like) the logic cell library typically includes several circuit realizations in order to satisfy various drive level requirements. The optimization processor 10 operates on an initial circuit design which is generally represented by a net list. The net list can be supplied from a synthesis engine 14 or directly input from a user interface 16. When a synthesis engine 14 is employed, the logic definition of this circuit is generated at the user interface 16 and is presented to the synthesis engine 14.

User interface 16 is of conventional form and includes such I/O devices as a keyboard, a digital pointer (mouse or track ball), a display unit such as a CRT and a graphical interface. Preferably, the user interface provides conversion back and forth from a net list to a schematic diagram.

The optimization processor 10 is also interfaced to electronic storage which will contain a gain-based model library 18. The gain-based model library 18 will include a size independent, gain-based model for each cell type in the logic cell library 12. The gain based model library 18 may be supplied as part of the logic cell library 12 or can be generated as a separate library by the optimization processor 10.

By operating on the initial net list in accordance with a method of the present invention, the optimization processor 10 generates an optimized net list file 20. The optimized net list file 20 represents the time optimized circuit design. Preferably, the optimized net list 20 can be fed back into the user interface 16 to display the optimized circuit embodiment in schematic form.

FIG. 2 is a flow chart illustrating an overview of a method of timing optimization operating in accordance with the present invention. Generally, the method is embodied in a computer program which is controlling the operation of the optimization processor 10. The method preferably operates on an initial net list which is retrieved from a stored data file or is provided by either the user interface 16 or synthesis engine 14 (step 22). The initial net list is a data file describing the logic circuit to be optimized.

The optimization processor 10 reads the logic cell library 12 (step 24) and determines whether the supplied library includes a gain-based, size independent model for each cell type (step 26). If a size independent model does not exist, the optimization processor 10 generates a gain-based model for each cell type (step 28). While several size independent models can be applied, the preferred model is a gain-based delay model which can be expressed as:

$$d = K_0 + K_1 G \quad (1)$$

where d is the delay from input to output of the logic element, $K_0$ and $K_1$ are constants and G is the gain of the logic element. The gain can further be expressed as:

$$G = \frac{C_L}{C_{in}} \quad (2)$$

where $C_L$ is a capacitive load being driven by the logic element and $C_{in}$ is the average input capacitance of the logic element. Because the input capacitance $C_{in}$ is directly proportional to the size of the logic element, the gain of each logic element is dependent both on the size of the logic element and the load it is driving.

To generate the gain based model for each cell type, the optimization processor 10 evaluates several empirical points for each circuit realization of the cell type to determine the relationship of gain versus delay. From these empirical data points, a least squares fit is sought to solve equation (1) for the constants $K_0$ and $K_1$. These values are then stored in the gain based model library 18.

Once a size independent model is available for each cell type, initial gain and delay values are assigned to each of the cell types (step 30). The present invention accomplishes this by evaluating a basic amplifier cell type (buffer or inverter) to establish an initial scalable delay based on a selected gain value. The scalable delay is expressed as:

$$\tau = K_1 G_0 \quad (3)$$

While any initial value of gain can be used, a value of $G_o$ in the range of 3.7–4, which is optimum for a logic inverter, is preferred. Once τ is established, this value is then used to set an initial gain value for each cell type by setting the initial scalable delay ($K_1 G_0$) equal to τ and solving for $G_0$. This is expressed by the equation: $G_o = \tau/K_1$.

An important aspect of the present invention is in size independent timing correction which is performed in step 34. The size independent timing correction process operates to minimize the delay in a critical path without violating any design constraints such as maximum slew rate and maximum drive capacity for the various logic elements. The present invention works to minimize the delay by manipulating the gain in each stage, from the output of the circuit back to the input of the circuit, in a heuristic manner that significantly reduces the required amount of trial and error calculation.

Figure 3:
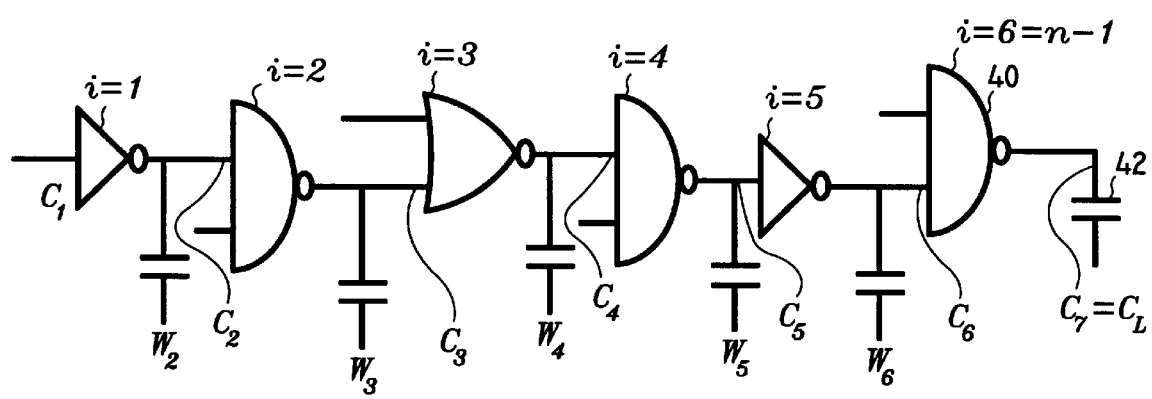
FIG. 3 is a schematic diagram depicting an illustrative critical path in a logic circuit, including representative pin capacitance and wire loads.
Figure 4:
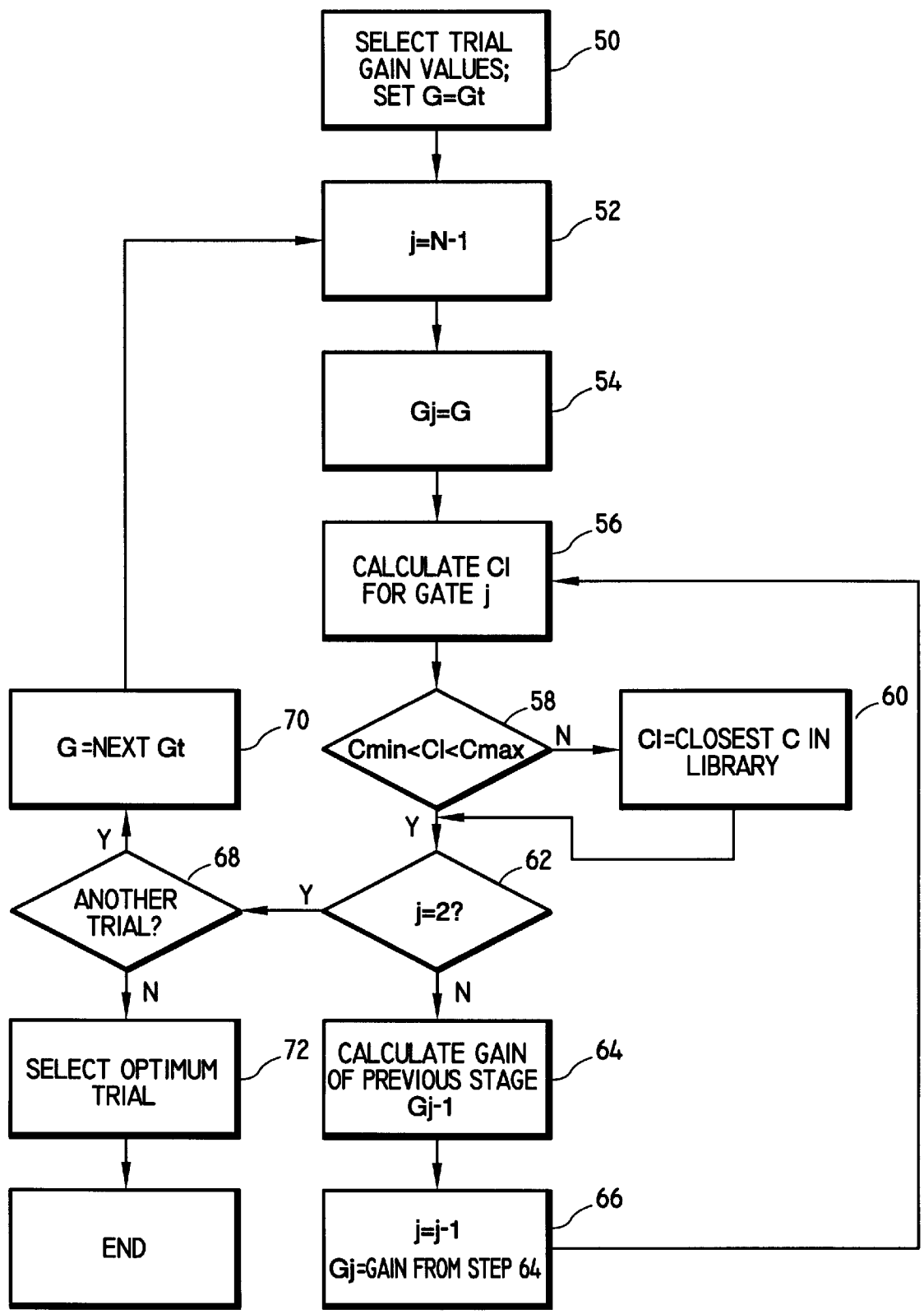
FIG. 4 is a flow chart illustrating the operation of a heuristic delay assignment method, in accordance with the present invention.

The heuristic algorithm for gain assignment is based on the observation that the optimal delay assignment for a chain of combinational logic gates in the presence of significant wire loads results in delays that are monotonically increasing from the output to the input. FIG. 3 illustrates an exemplary circuit critical path that will be used to explain the employed heuristic. The gates 40 are labeled with an index counter, i, from the input gate (i=1) to the output gate (i=n–1). The circuit in FIG. 3 has seven relevant loads $C_n$ 42, for consideration: the input load, C1 and the load presented to each of the six gates in the critical path (C2–C7). In addition, wire loads and off critical path pin capacitances, $w_i$, are presented at each logic stage that must be accounted for.

The delays in the critical path will be increasing monotonically from the output gate (n–1) to the input gate (i=1). The ratio of this increase is such that:

$$d_i = \Gamma_{i+1} \cdot d_{i+1} \quad (4)$$

where $\Gamma_i = 1 + w_i/C_i$. For a given topology and layout, the wire loads, $w_1$, are known. Therefore, by assigning a gain value to the output stage (n–1), the delays and pin capacitances of the entire critical path can be determined. This is expressed by the relationships:

$$d_{i+1} = K_1^{i+1} G_{i+1} \quad (5)$$

and $$C_{i+1} = (C_{i+2} + W_{i+2})/G_{i+1} \quad (6)$$

From these equations, it is clear that the gain of gate i is dependent upon the gain of gate i+1. This can be expressed by the equation:

$$G_i = \left(1 + \frac{W_{i+1} \cdot G_{i+1}}{C_{i+2} + W_{i+2}}\right) \cdot \frac{K_1^{i+1} \cdot G_{i+1}}{K_1^i} \quad (7)$$

The heuristic of the present invention uses these equations to provide an optimum delay solution in the critical path of a circuit. This is illustrated in the flow chart of FIG. 5. First, a number of trial gain values are selected (step 50). For example, six values can be selected over the range of [2.5, 5.0] to provide a set of trial gain values, $G_0 = \{2.5, 3.0, 3.5, 4.0, 4.5, 5.0\}$. From this set, the first value is selected.

A counter, j, is set to a value equal to the number of gates in the critical path (step 52). The gate corresponding to the value of counter j is then assigned a gain value equal to the current value of the gain ($G_j$) (step 54). In the first instance, j is pointing at the output stage and $G_j$ is equal to $G_t$. Once the gain assignment is performed, the load capacitance of the gate corresponding to the counter j is then calculated using equation 6. If the calculated capacitance is out of range (step 58) for the given library, the capacitance is assigned to the closest available value in the library (step 60).

The parameters of the input stage, j=1, is determined by the circuit description which defines the maximum input capacitance for this stage. Therefore, the delay for this stage is not heuristically assigned. To insure this, the next step in the heuristic is to determine if j=2 (step 62). If j≠2, the gain of the previous stage (j−1) is then calculated based on equation 7 (step 64). The counter is then decremented to correspond to the next stage back in the critical path and $G_j$ is assigned the value which was calculated in step 64 (step 66). The method then returns to step 56 where the capacitance of the current stage j is calculated.

Returning to step 62, when j=2, the delay assignment heuristic for the selected trial gain value is complete. The method then determines the total delay value of the critical path for that trial and advances to determine if additional trial gain values are present (step 68). If additional values of $G_t$ are left to be evaluated, the next value of $G_t$ is selected from the set (step 70) and the process repeats from step 52. If the final value of $G_t$ has been evaluated, the method then determines which trial gain value resulted in the optimum delay value for the critical path (step 72) for that set of trials. In this way, the delay assignment is achieved in a fixed number of passes through the critical path.

The timing optimization process just described is only implemented on the critical path of the net list, i.e., that net path with the longest associated delay. After the initial critical path is optimized, a new critical path may be presented. In that case, the size independent timing correction process is performed on that path as well.

Returning to FIG. 2, step 34 further includes the step of legalization. Legalization refers to the process of rule checking to ensure that the resulting design does not exceed any design limits. Unlike the timing correction step, legalization involves the evaluation of all paths in the net list. Where a path is found that exceeds a maximum design constraint, conventional steps are performed to correct the problem. These conventional steps include remapping, cloning, buffering and the like.

After legalization, step 34 includes the further operation of area recovery. Area recovery is an operation which is performed to optimize a physical embodiment of the circuit. Conventional area recovery engines are used which employ transformations such as buffering and gain reassignment to recover excess area in the resulting circuit layout.

Because legalization and area recovery modify the time optimized net list, once these operations are complete, the resulting net list is again evaluated and optimized for critical path timing. This is illustrated in FIG. 2 by flow line 36. The operations within step 34 are repeated until the resulting performance improvement (based on the previous pass) is below a predetermined threshold value.

Following the size independent timing correction of step 34, the optimization routine of the present invention operates to transform the sizeless gain-based gates in the net list into a discrete circuit realization using available cells from the logic cell library 12 (step 38). In step 38, the size of each gate is established based on the assigned gain (G) of the gate and load ($C_L$) being driven by the gate. The load the gate is to drive is available since the discretization of each gate is performed in a breadth-first manner, from the output stage back through each layer to the input stage.

In a continuous library, size assignment is done by using the size/load curve presented in the library 12. When continuous libraries are not available, the present invention achieves similar results utilizing the discrete cells in the logic cell library 12. For the given gain and load requirements, the available gates for each cell type are evaluated to find the closest match for these requirements. A suitable element is then selected to provide a minimum error function.

The result of this operation is to provide an optimized net list which uses conventional elements available in the logic cell library 12. The optimized net list can be stored as a data file 20 and can also be presented to the user interface 16 for display in the form of a schematic diagram.

Having described preferred methods of the present invention, it is noted that modifications and variations can be made by persons skilled in the art in light of the above teachings. It is therefore to be understood that changes may be made in the particular embodiments of the invention disclosed which are within the scope and spirit of the invention as outlined by the appended claims.

What is claimed is:

1. A method for performing size independent optimization of a logic circuit design comprising the steps of:
   creating a gain-based model for each cell type in a logic library;
   deriving initial conditions for a gain and a delay for each of said cell types, said deriving step includes the steps of:
   selecting an initial gain value for a selected cell type;
   calculating an initial scalable delay for said selected cell type;
   setting the initial scalable delay for the remaining cell types equal to said calculated initial scalable delay; and
   calculating an initial gain value for said remaining cell types;
   performing gain-based optimization of the circuit design; and
   transforming the optimized circuit design into a discrete solution with conventional library elements, resulting in an optimized circuit embodiment.

2. The method for performing size independent timing optimization as defined by claim 1, wherein said creating step includes the steps of:

empirically evaluating a gain-delay characteristic at a plurality of points for at least one element in each of said cell types;

fitting a curve to said plurality of points; and solving a gain-delay equation based on said curve.

3. A method for performing size independent optimization of a logic circuit design comprising the steps of:

creating a gain-based model for each cell type in a logic library;

deriving initial conditions for a gain and a delay for each of said cell types;

performing gain-based optimization of the circuit design, said gain-based optimization step includes the steps of:
selecting a set of trial gain values;
assigning an initial gain value from said set to an output stage of the circuit;
heuristically determining gain values of stages preceding the output stage;
selecting a next value in said set;
repeating said assigning and heuristically determining steps until all trial gain values in said set are evaluated; and
determining which trial gain value resulted in the optimum delay solution from said set of trials; and transforming the optimized circuit design into a discrete solution with conventional library elements, resulting in an optimized circuit embodiment.

4. The method for performing size independent timing optimization as defined by claim 3, wherein said heuristic determining step further includes the steps of:

(a) setting a pointer to a current stage in the circuit;

(b) calculating the load capacitance of said current stage in the circuit corresponding to said pointer;

(c) calculating the gain of a previous stage in the circuit;

(d) decrementing said pointer; and (e) repeating steps b) through d) until the pointer is directed to the second stage in the circuit.

5. The method for performing size independent timing optimization as defined by claim 3, wherein said gain-based optimization step includes the steps of:

design rule checking after said repeating step; and performing area recovery.

6. A method for performing size independent optimization of a logic circuit design comprising the steps of:

creating a gain-based model for each cell type in a logic library;

deriving initial conditions for a gain and a delay for each of said cell types;

performing gain-based optimization of the circuit design; and transforming the optimized circuit design into a discrete solution with conventional library elements, resulting in an optimized circuit embodiment, said transforming step includes the steps of:
determining whether the cell types are defined by a continuous model;
if said cell types are defined by a continuous model, selecting a size of each element in the circuit design based on a size/load curve provided by said model; and
if said cell types are not defined by a continuous model, selecting a discrete embodiment from the library for each element in the circuit design that minimizes a design error.

7. The method for performing size independent timing optimization as defined by claim 6, wherein said circuit design is represented in the form of a net list.

8. A computer based logic circuit synthesis and optimization system comprising:

an optimization processor;

a logic cell library including a plurality of cell types, each cell type having at least one associated logic element, said logic cell library being operatively coupled to said optimization processor;

a storage medium having stored codes executable by said optimization processor for causing the optimization processor to execute method steps in providing gain-based optimization of a logic circuit design, the method steps including:
selecting a set of trial gain values;
assigning an initial gain value from said set to an output stage of the circuit;
heuristically determining gain values of stages preceding the output stage;
selecting a next value in said set;
repeating said assigning and heuristically determining steps until all trial gain values in said set are evaluated; and
determining which trial gain value resulted in the optimum delay solution from said set of trial; and a gain based model library, said gain based model library including a size independent model for each cell type employed in said circuit design, said optimization processor receiving said circuit design, said logic cell library including said plurality of cell types of different sizes, and said gain based model library and providing an optimized circuit design.

9. A computer based logic synthesis and optimization system as defined by claim 8, wherein:

said logic cell library is a discrete library; and said gain based model library is generated by said optimization processor.

10. A computer based logic synthesis and optimization system as defined by claim 8, further including a graphical user interface for providing a circuit design.

11. A computer based logic synthesis and optimization system as defined by claim 10, wherein said graphical user interface includes means for converting a circuit representation from a graphical representation to a net list representation.

12. A computer based logic synthesis and optimization system as defined by claim 11, wherein said graphical user interface receives and displays the optimized circuit design from said optimization processor.

13. The computer based logic synthesis and optimization system as defined by claim 10, further including a logic synthesis engine for providing a net list to said optimization processor.

* * * * *